United States Patent [19]
Garwood, Jr.

[11] Patent Number: 5,275,690
[45] Date of Patent: Jan. 4, 1994

[54] METHOD AND APPARATUS FOR WET CHEMICAL PROCESSING OF SEMICONDUCTOR WAFERS AND OTHER OBJECTS

[75] Inventor: Gerald A. Garwood, Jr., Santa Barbara, Calif.

[73] Assignee: Santa Barbara Research Center, Goleta, Calif.

[21] Appl. No.: 899,792

[22] Filed: Jun. 17, 1992

[51] Int. Cl.⁵ .................. B44C 1/22; H01L 21/306
[52] U.S. Cl. ...................... 156/637; 156/345; 156/662
[58] Field of Search ............... 156/345, 637, 651, 654, 156/657, 662; 252/79.2, 79.5; 134/3, 41

[56] References Cited

U.S. PATENT DOCUMENTS

| | | | |
|---|---|---|---|
| 3,664,354 | 5/1972 | Minbiole et al. | 156/345 X |
| 4,376,009 | 3/1983 | Kunz | 156/345 X |
| 4,482,425 | 11/1984 | Battey | 156/637 |
| 4,544,446 | 10/1985 | Cady | 156/639 |

*Primary Examiner*—William A. Powell
*Attorney, Agent, or Firm*—W. C. Schubert; W. K. Denson-Low

[57] ABSTRACT

A semiconductor wafer (52) or other object is retained in a cell (50) such that a thin space (60) having a laterally spaced inlet (62) and outlet (64) is provided above the wafer surface (52a). A plurality of chemicals including solvents, etchants, etc. are provided in individual pressurized containers (18,20,22,24,28,44). A valve (42) connects a selected container (18,20,22,24,28,44) to the inlet (62) for a length of time sufficient for the respective chemical to fill the space (60), and also connects the outlet (64) to an individual receptacle (26,30) for the chemical. The valve (42) then disconnects the container (18,20,22,24,28,44) and receptacle (26,30) from the inlet (62) and outlet (64) and traps the chemical in the space (60) for a length of time sufficient for the chemical to react with the wafer surface (52a). This operation is repeated such that the wafer surface (52a) is exposed to a number of fresh volumes of the chemical in a pulsating manner sufficient to perform a desired processing operation, and used volumes of the chemical are discharged from the space (60) into and captured by the receptacle (26,30). Additional containers (32) may be provided to enable a non-reactive gas, cleaning agent, etc. to be passed through the space (60) to dry and sanitize the surface (52a) and purge the flow passageways of used chemical prior to processing with another chemical.

14 Claims, 6 Drawing Sheets

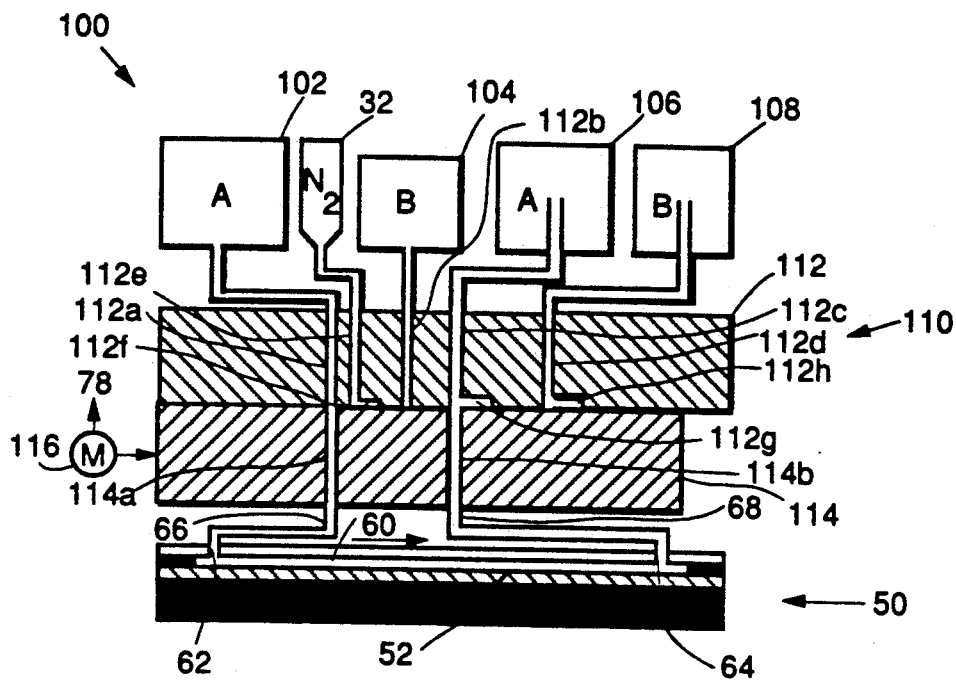
FIG. 5a.
FIG. 5b.
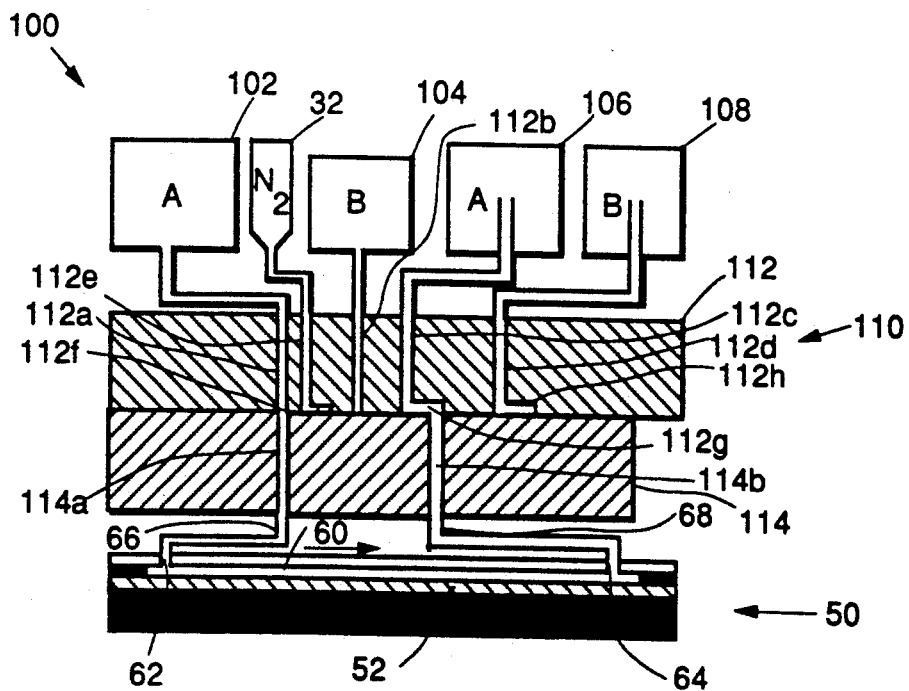

METHOD AND APPARATUS FOR WET CHEMICAL PROCESSING OF SEMICONDUCTOR WAFERS AND OTHER OBJECTS

BACKGROUND OF THE INVENTION

1. Field of the Invention

The present invention generally relates to wet chemical surface processing of material objects such as semiconductor wafers, and more specifically to a method and apparatus for performing such surface processing using very small volumes of chemicals and without environmental pollution.

2. Description of the Related Art

Semiconductor substrate wafers must be prepared by cleaning, etching and other wet chemical processes before microelectronic devices can be fabricated in the surfaces thereof. The subject of surface preparation of wafers is presented in an article entitled "Wafer Cleaning: Can Dry Systems Compete", by R. Iscoff, in Semiconductor International, November, 1991, pp. 50–54.

Conventional wet chemical processes for cleaning and etching wafers are generally crude, utilize disproportionate volumes of chemicals, create environmental pollution and toxic waste disposal problems, require bulky and expensive support systems and use substantial amounts of electrical power. These processes include such expedients as squirt-bottle rinsing, beaker immersion, spraying and flushing under a running tap, and lack the precision, cleanliness and parametric control which is critical to consistently produce semiconductor wafer surfaces with the required purity, composition and crystal structure.

The chemicals used, especially acids, are highly toxic, and fume hoods, motor-driven air scrubber fans and other expensive and bulky equipment must be provided to remove vapors from the working environment. In addition, acid and base treatment facilities must be provided for reducing the toxicity of used chemicals prior to disposal.

SUMMARY OF THE INVENTION

An apparatus utilizing a method of wet chemical surface processing embodying the present invention generally includes wet chemical reagent dispensing sub-units, a processing cell for retaining a semiconductor wafer or other object to be processed and effluent capturing sub-units. More specifically, the wafer is retained in the cell such that a thin space having a laterally spaced inlet and outlet is provided above the wafer surface.

A plurality of chemicals including solvents, etchants, etc. are provided in individual pressurized containers of the dispensing sub-units. A valve connects a selected container to the inlet for a length of time sufficient for the respective chemical to fill the space, and also connects the outlet to an individual receptacle for the chemical in one of the effluent capturing sub-units. The valve then disconnects the container and receptacle from the inlet and outlet and traps the chemical in the space for a length of time sufficient for the chemical to react with the wafer surface.

This operation is repeated such that the wafer surface is exposed to a number of fresh volumes of the chemical in a pulsating manner sufficient to perform a desired processing operation, and used volumes of the chemical are discharged from the space into and captured by the receptacle. Additional containers and receptacles are provided to enable a non-reactive gas, cleaning agent, etc. to be passed through the space to dry and sanitize the surface and purge the flow passageways of used chemical prior to processing with another chemical.

The present method and apparatus achieve the following goals:

(1) Minimization of the volume of solvents, etchants, de-ionized water, etc. required to perform wet chemical surface processes. The volume of chemicals required to practice the present process can be less than one-hundredth that required for conventional processes.

(2) Capture of all chemical effluents generated by the process, thereby eliminating environmental pollution.

(3) Increased reproducibility of wet chemical processing parameters.

(4) Achievement of a high degree of control of the surface chemistry of cleaned and etched semiconductor substrate wafer surfaces.

The present invention also provides benefits in safety and energy conservation. Safety to workers is enhanced due to reduced exposure because hazardous materials are enclosed in a closed circuit. Emissions to the atmosphere are eliminated, thereby preventing health hazards to the public and precluding the need for fume hoods and air scrubbers in the processing area. Savings in energy occur due to elimination of the electrical power required to drive large air scrubber fans and pumps. In addition, acid and base treatment systems are unnecessary, and the present apparatus can be installed in stand-alone facilities where these treatment systems do not exist.

These and other features and advantages of the present invention will be apparent to those skilled in the art from the following detailed description, taken together with the accompanying drawings, in which like reference numerals refer to like parts.

DESCRIPTION OF THE DRAWINGS

FIGS. 5a to 5d are simplified sectional diagrams illustrating a valve arrangement of the apparatus.

DETAILED DESCRIPTION OF THE INVENTION

Figure 1:
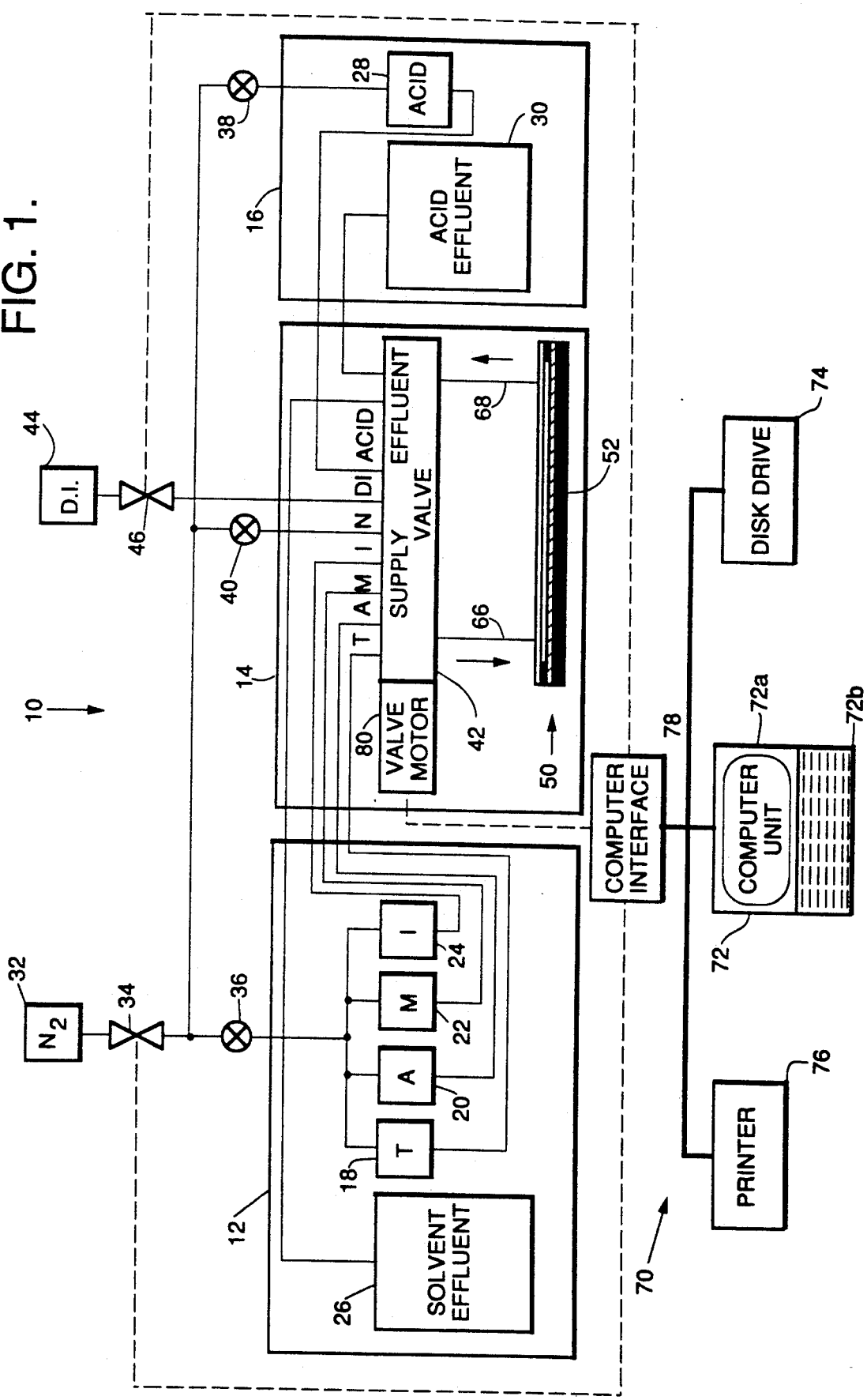
FIG. 1 is a block diagram illustrating a wet chemical surface processing apparatus embodying the present invention.

As illustrated in FIG. 1, a wet chemical surface processing apparatus embodying the present invention is generally designated as 10, and includes a wet chemical reagent or solvent dispensing and effluent capturing unit 12, a processing or treatment cell unit 14 and an etchant dispensing and capturing unit 16. The apparatus 10 has been named "S.P.E.C.I.A.L." system by the Inventor, which is an acronym for "Surface Proximity Environmentable Chemically Integrated Airless Loop".

The unit 12 has a plurality of sub-units including containers which contain liquid chemicals including solvents, cleaning agents, de-ionized water, etc. for chemical processing of the surface of a semiconductor substrate wafer or other object. More specifically, the unit 12 is exemplified as including a container 18 for toluene, a container 20 for acetone, a container 22 for methanol and a container 24 for isopropanol. The unit 12 further includes a solvent effluent receptacle 26 for capturing used solvents from the containers 18, 20, 22 and 24.

The unit 16 similarly has sub-units including an etchant container 28 which contains either an acid such as a mixture of sulfuric acid, hydrogen peroxide and water in the exemplary ratio of 5:1:1 by volume or a base such as a 1% (by volume) solution of ammonium hydroxide in water, and an etchant effluent receptacle 30 for capturing used etchant from the container 28. The containers 18, 20, 22, 24 and 28 typically have a volume of one-half liter.

The apparatus 10 further includes a container 32 for supplying a pressurized gas which is non-reactive with the surface of the object to be processed. Nitrogen ($N_2$) is a preferred gas for use in the apparatus 10. The container 32 is connected through an electrical solenoid safety valve 34 and check valves 36 and 38 to the containers 18, 20, 22, 24 and 28 respectively for pressurization thereof, and also through a check valve 40 to a valve 42 of the unit 14. The containers 18, 20, 22, 24 and 28 and receptacles 26 and 30 are also connected to the valve 42 as illustrated. The apparatus 10 further includes a container 44 for pressurized de-ionized (D.I.) water which is connected through a safety valve 46 to the valve 42.

Figure 2:
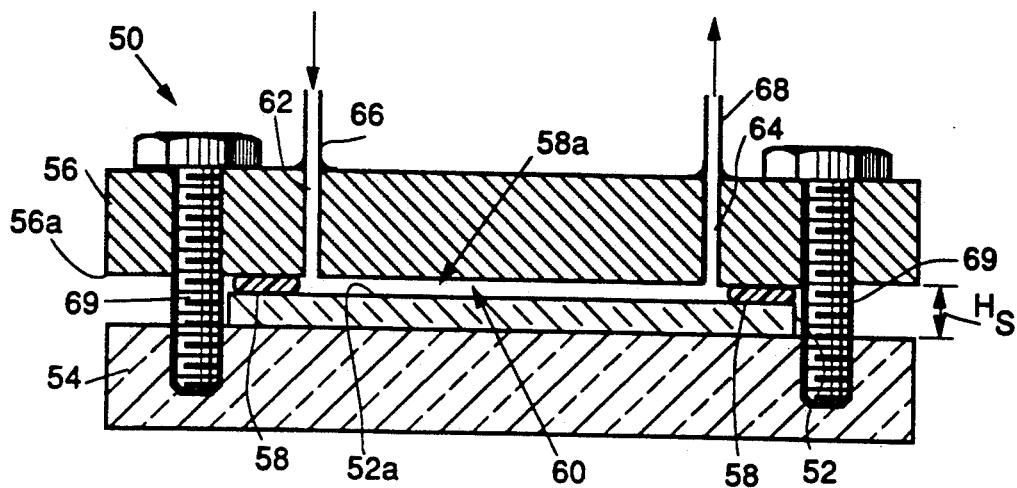
FIG. 2 is a simplified sectional view illustrating a processing or treatment cell of the apparatus.

As illustrated in FIG. 2, the unit 14 includes a processing or treatment cell 50 for retaining a semiconductor substrate wafer 52 or other object having a surface 52a for chemical processing. The wafer 52 is pressed between a lower plate 54 and an upper plate 56 made of fused quartz or other non-reactive material. A gasket 58 formed of teflon or the like is sealingly pressed between the surface 52a of the wafer 52 and a surface 56a of the plate 56. The gasket 58 is formed with a hole 58a therethrough having a shape corresponding to the portion of the wafer surface 52a which is to be processed.

The surfaces 52a and 56a in combination with the hole 58a define a processing space 60 to which the surface 52a of the wafer 52 is exposed. An inlet 62 is formed through the plate 56 and opens through the surface 56a into the space 60 near the left end thereof as viewed in FIG. 2. An outlet 64 is formed through the plate 56 and opens through the surface 56a into the space 60 near the right end thereof. The inlet 62 and outlet 64 are laterally spaced from each other to enable flow of fluid from the inlet 62 through the space 60 to the outlet 64. Further illustrated are inlet and outlet tubes or conduits 66 and 68 which connect the inlet 62 and outlet 64 respectively to the valve 42, and clamping means in the form of screws 69 for pressing the wafer 52 and gasket 58 between the plates 54 and 56.

A computer system 70, which may be a general purpose personal computer, typically includes a main computer unit 72 having a display screen 72a and keyboard 72b and, although not specifically illustrated, a central processing unit, memory, etc. The computer system 70 is further illustrated as including a disc drive 74, printer 76 and interface 78 which connects the unit 72 to the safety valves 34 and 46. The disc drive 74 stores an operating program for the system 70 which can be retrieved and executed by the unit 72. The interface 78 also connects the main unit 72 to a valve motor 80 which actuates the valve 42. The motor 80 may be a conventional stepping motor or any other type of motor which is capable of actuating the valve 42 in the required manner.

In operation, the valve 42, under control of the computer system 70 and motor 80, connects the inlet conduit 66 of the cell 50 to one of the containers 18, 20, 22, 24, 28, 32 or 44. When the inlet conduit 66 is connected by the valve 42 to one of the containers 18, 20, 22, 24 of the unit 12 or the $N_2$ container 32, the valve 42 connects the outlet conduit 68 to the solvent effluent receptacle 26. When the inlet conduit 66 is connected by the valve 42 to the etchant container 28 of the unit 16, the D.I. container 44 or the $N_2$ container 32, the valve 42 connects the outlet conduit 68 to the etchant effluent receptacle 30.

The valve 42 is controlled by the computer system 70 and motor 80 to connect the containers and receptacles to the cell 50 in a predetermined sequence which corresponds to a desired processing operation for the wafer 52. The processing is enhanced if the valve 42 is further controlled to supply the selected chemical to the cell 50 in a pulsating, or "pulse-wait" manner. This exploits the principle from analytical chemistry that multiple, low-volume, surface-proximity rinses are more effective and less wasteful for cleaning contaminants from surfaces of materials than single macro-volume bulk rinses as described in a textbook entitled "Fundamentals of Analytical Chemistry", by D. Skoog et al, Holt, Rinehart and Winston, New York 1963, pp. 116 and 118.

It will be assumed for purposes of example that it is first desired to process the surface 52a of the wafer 52 by exposing it to toluene from the container 18. The valve 42 is actuated to connect the inlet conduit 66 to the container 18 for a length of time sufficient for a volume of toluene to flow from the container 18 into and fill the space 60 in the cell 50, and connect the outlet conduit 68 to the receptacle 26. Then, the valve 42 is actuated to disconnect the inlet and outlet conduits 66 and 68 from all of the containers and receptacles and thereby trap the toluene in the space 60. The valve 42 is maintained in the disconnected state for a length of time which is sufficient for the toluene to achieve a desired chemical reaction with the surface 52a of the wafer 52.

Then, the valve 42 is actuated to again connect the inlet conduit 66 to the container 18 for a length of time sufficient for a new, fresh volume of toluene to flow from the container 18 into and fill the space 60 in the cell 50, and connect the outlet conduit 68 to the receptacle 26. The used volume of toluene is displaced from the space 60 by the new volume, and flows through the outlet conduit 68 and valve 42 to the receptacle 26. The valve 42 is again actuated to the disconnected state for the length of time sufficient for the toluene to achieve the desired reaction.

This sequence is repeated a sufficient number of times for the surface 52a of the wafer 52 to be completely processed by the toluene. Then, the valve 42 connects another container 20, 22, 24, 28 or 44 and receptacle 26 or 30 to the cell 50 and the process is repeated with the next selected chemical.

It is desirable to dry and sanitize the surface 52a by removing all previously used chemicals therefrom and purge the conduits and other flow passageways of the apparatus 10 of the previous chemical prior to processing the surface 52a with another chemical. This is accomplished by actuating the valve 42 to connect the inlet conduit 66 to the N₂ container 32 and connect the outlet conduit 68 to the receptacle 26 or 30 corresponding to the previous chemical. The pressurized N₂ gas dries the surface 52a of the wafer 52, and blows all of the previous chemical out of the cell 50, valve 42 and conduits of the apparatus 10 into the respective receptacle 26 or 30. If desired (as for the case in which the previous chemical is D.I. water), the valve 42 may connect the container 24 to the inlet conduit prior to the N₂ purge step, to pass isopropanol through the system and thereby enhance sanitization.

As illustrated in FIG. 2, the height $H_S$ of the space 60 above the surface 52a of the wafer 52 (the distance between the surfaces 52a and 56a) is selected to be as small as practical to minimize the volume of chemicals used for processing. The height $H_S$ is preferably between approximately 75 and 500 micrometers, With the optimal value being on the order of 100 micrometers. However, the scope of the invention is not limited to any particular value of $H_S$. For a typical wafer processing operation in which the area of the surface 52a to be processed is 10 cm² and the height $H_S$ is 100 micrometers, the volume of the space 60, and thereby the volume of chemical used per pulse, is 0.10 ml.

The pressure in the containers 18, 20, 22, 24, 28 and 44 must be sufficient to overcome the fluid surface tension in the space 60 and connecting conduits, and cause the respective chemicals to flow therefrom into the space 60, and out of the space 60 to the receptacle 26 or 30. In some circumstances, hydrostatic pressure alone will be sufficient. In other cases, the N₂ gas overpressure is selected to cause the chemicals to flow with a predetermined flow rate.

The dwell time T, or the time each volume of chemical is allowed to remain in the space 60 to react with the surface 52a, depends on the particular chemical and process step. However, exemplary dwell times may be approximated by calculating the dwell time T as the length of time required for a contaminant on the surface 52a to diffuse through the chemical to the surface 56a. The time $T = H_S^2/2D$, where D is the coefficient of diffusion for the contaminant in the chemical. The diffusion times for exemplary weak and strong electrolytes are given in the following TABLE, with $H_S$ being 100 micrometers and the fluid temperature being 25° C.

TABLE

| SPECIES | | D (cm²) | T (sec) |
|---|---|---|---|
| WEAK & NON-ELECTROLYTES | CITRIC ACID (0.1 M) | $0.661 \times 10^{-5}$ | 7.6 |
| | GLYCINE | $1.064 \times 10^{-5}$ | 4.7 |
| STRONG ELECTROLYTES | NaCl (0.1 M) | $1.483 \times 10^{-5}$ | 3.37 |
| | HCl (0.1 M) | $3.050 \times 10^{-5}$ | 1.64 |

The greatly reduced volume of chemicals which can be achieved by the present invention will be realized by comparing an exemplary process utilizing the method of the invention with a conventional process. In the example, it is required to sequentially process the surface of a wafer with toluene, acetone, methanol and isopropanol (T.A.M.I.). In a conventional process, these chemicals are applied using squirt bottles, with approximately 50 ml of each chemical being used for a total of 200 ml of chemical.

Using the present method, four pulses of each chemical are required, for a total of 16 pulses. At a volume of 0.1 ml/pulse, the total volume of chemicals used by the invention is 1.6 ml, less than one-hundredth the volume required for the conventional process. The length of time required for the present and conventional processes are comparable, on the order of one to two minutes. The time the valve 42 is connected to fill the space 60 with chemical is typically less than one second, whereas the dwell time T for each chemical is approximately 5–10 seconds per pulse-wait cycle.

Figure 3:
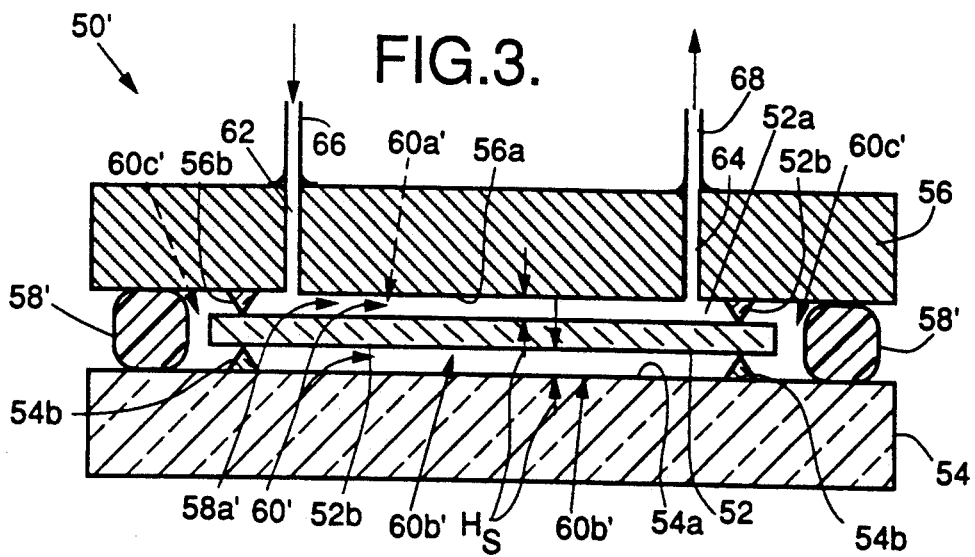
FIG. 3 is similar to FIG. 2, but illustrates a modified processing cell.

FIG. 3 illustrates a modified processing cell 50' which is designed to enable chemical processing of both the surface 52a, and an opposite surface 52b, as well as a peripheral edge 52c of the wafer 52. Like elements are designated by the same reference numerals used in FIG. 2, whereas corresponding but modified elements are designated by the same reference numerals primed.

In the apparatus 50', the gasket 58' is made thicker than the wafer 52 such that the hole 58a', in combination with the surface 56a of the plate 56 and a surface 54a of the plate 54 define an enclosure 60' in which the wafer 52 is completely enclosed. The enclosure 60' has an upper portion which defines a processing space 60a' above the surface 52a, and a lower portion which defines a processing space 60b' below the surface 52b of the wafer 52. The hole 58a' through the gasket 58' is also made larger than the wafer 52 such that a peripheral space 60c' is defined in the enclosure 60' between the peripheral edge 52c of the wafer 52 and the inner periphery of the hole 58a'. The space 60c' interconnects the upper and lower processing spaces 60a' and 60b' such that the chemicals pass through both spaces 60a' and 60b' from the inlet 62 to the outlet 64. In this case, the outlet 64 is preferably formed through the plate 54 rather than through the plate 56 to facilitate rapid and complete displacement of chemical from the space 60b' under the wafer 52.

Further illustrated are projections 54b which project upwardly from the surface 54a of the plate 54, and projections 56b which project downwardly from the surface 56a of the plate 56. The projections 54b and 56b each have a height of $H_S$ and engage with the surfaces 52b and 52a, such that the spaces 60a' and 60b' each have the height $H_S$ above the respective surfaces 52a and 52b respectively.

Although the processing cells 50 and 50' have been described and illustrated as retaining an object in the form of a flat wafer for processing, the invention is not so limited. Objects having cylindrical, spherical or peripheral surfaces of other shapes may be processed using the present method and apparatus by designing the processing cell to have a processing space with a shape conjugate to the object.

Figure 4:
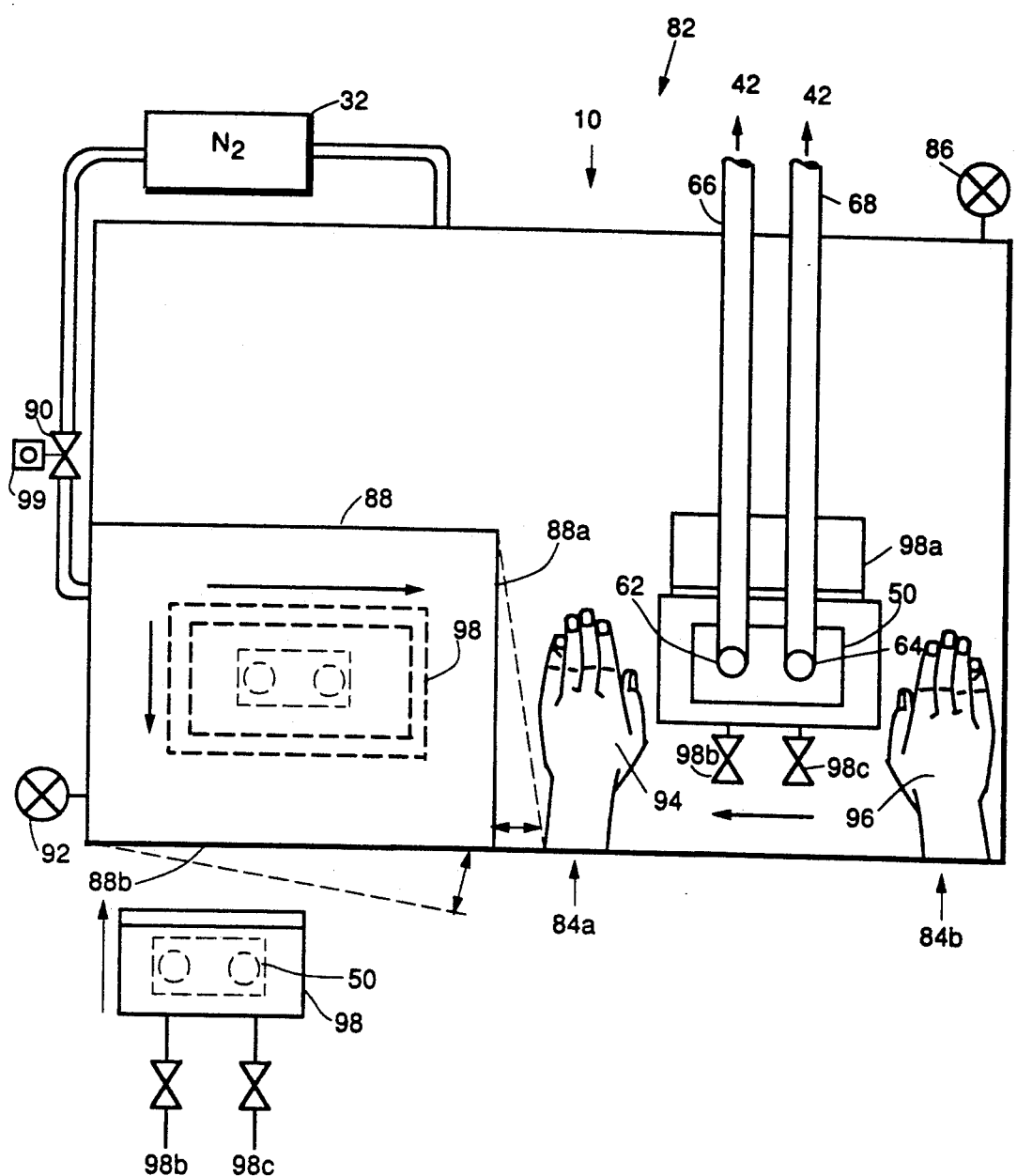
FIG. 4 is a simplified diagram illustrating an arrangement for sanitary handling of objects for processing by the apparatus.

FIG. 4 illustrates, in simplified plan view, a system 82 for sanitary handling of objects for processing by the apparatus 10. The system 82 includes a hermetic enclosure 84 known in the art as a "glove box" which is constantly filled with N₂ gas from the supply 32. A check valve 86 enables air to be purged from the enclosure as N₂ gas is supplied therein.

A portion of the enclosure 84 is partitioned into a hermetic "load-lock" chamber 88, having a door 88a which opens into the main portion of the enclosure 84 and another door 88b which opens external of the chamber 88 and enclosure 84. With both doors 88a and 88b closed, the chamber 88 is sealed and can be filled with N₂ gas from the supply 32 via a valve 90. A check valve 92 is provided to enable air to be purged from the chamber 88. Left and right rubber gloves 94 and 96 sealingly extend into the enclosure 84 from holes 84a and 84b formed through the wall of the enclosure 84. The gloves 94 and 96 are hermetically sealed to the inner peripheries of the holes 84a and 84b such that an operator can insert his hands into the gloves 94 and 96 from outside and handle objects inside the enclosure 84 without violating the hermetic sealing thereof.

The system 82 further includes a transfer vessel 98 for transferring the wafer 52 into and out of the enclosure 84. The vessel 98 includes a lid 98a which may be closed to hermetically seal the vessel 98, and valves 98b and 98c which enable the vessel 98 to be purged of air and filled with $N_2$ gas.

To use the system 82, the wafer 52 is inserted into the vessel 98, the lid 98a closed, and the vessel 98 is filed with $N_2$ gas via the valves 98b and 98c. The door 88a of the chamber 88 is closed, the door 88b is opened, and the vessel 98 is inserted into the chamber 88. The door 88b is then closed, and the chamber 88 is filled with $N_2$ gas via the valve 90. An actuating member such as a foot-switch or push-button 99 may be provided which the operator can push to open the valve 90 and allow $N_2$ gas from the supply 32 to fill the chamber 88. Alternatively, the valve 90 may be left open constantly while the system 82 is in use to continuously connect the $N_2$ supply to the chamber 88. vessel 98 from the chamber 88 into the main portion of the enclosure 82 using the gloves 94 and 96, opens the lid 98a of the vessel 98 and transfers the wafer 52 from the vessel 98 to the cell 50 or 50'. The valve 42 is then actuated to perform the processing operation on the wafer 52 in the cell 50 as described above.

After completion of processing, the operator removes the wafer 52 from the cell 50 or 50', transfers the wafer 52 into the vessel 98, closes the lid 98a, moves the vessel 98 into the chamber 88 and closes the door 88a. The operator then opens the door 88b and removes the vessel 98 from the chamber 88. The wafer 52, after surface processing by the apparatus 10, is hermetically sealed in an $N_2$ gas environment in the vessel 98, and can be transported in a sterile manner to another facility for further processing.

FIGS. 5a to 5d illustrate an apparatus 100 for explaining how the containers and receptacles are connected to the cell 50 by valve actuation. For simplicity of description and illustration, the apparatus 100 is designed to process the wafer 52 using only two chemicals, A and B. The first chemical A is provided in a container 102, whereas the second chemical B is provided in a container 104. Receptacles 106 and 108 are provided for capturing the chemicals A and B respectively after use thereof for processing the wafer 52.

The simplified apparatus 100 includes a valve 110 having upper and lower blocks 112 and 114 respectively. The lower block 114 is linearly movable relative to the upper block 112 in the leftward and rightward directions as viewed in the drawings by a motor 116 under control of the computer system 70.

Figure 6A:
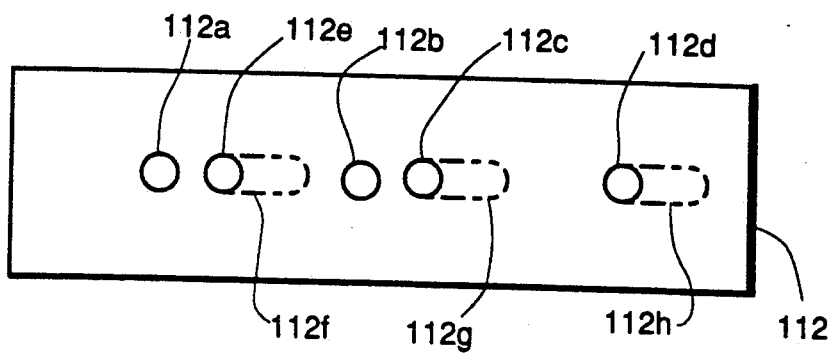
FIGS. 6a and 6b are plan views illustrating the upper and lower parts of the valve shown in FIGS. 5a to 5d.
Figure 6B:
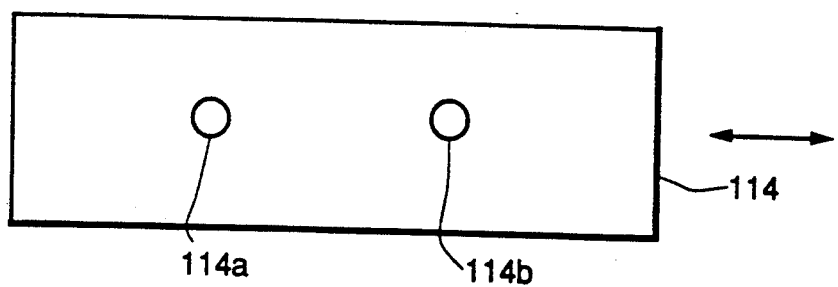

The blocks 112 and 114 are further illustrated in plan view in FIGS. 6a and 6b respectively. The lower block 114 has inlet and outlet ports 114a and 114b which are formed vertically therethrough, have circular cross-sections and are connected at their lower ends to the conduits 66 and 68 respectively. The upper block 112 has inlet ports 112a and 112b and outlet ports 112c and 112d which are formed vertically therethrough, have circular cross-sections and are connected at their upper ends to the containers 102 and 104 and the receptacles 106 and 108 respectively. The upper block 112 is further formed with an inlet port 112e which is connected at its upper end to the $N_2$ supply 32. The lower surface of the upper block 112 is further formed with lateral grooves 112f, 112g and 112h which extend rightwardly from the ports 112e, 112c and 112d respectively.

FIG. 5a illustrates the block 114 as being moved to a leftmost position relative to the block 112 for filling the cell 50 with the chemical A. More specifically, the ports 112a and 114a are aligned, so that the chemical A flows therethrough from the container 102 through the conduit 66 into the cell 50. The ports 112c and 114b are aligned, such that the chemical A can flow therethrough from the cell 50 and outlet conduit 68 to the receptacle 106.

In FIG. 5b, the block 114 is moved rightwardly to an intermediate position in which the port 112e is aligned with the port 114a and the groove 112g is aligned with the port 114b. This connects the $N_2$ supply 32 to the inlet conduit 66 and connects the receptacle 106 to the outlet conduit 68. The apparatus 100 is purged of the chemical A by the $N_2$ gas flowing from the supply 32 through the cell 50 and connecting conduits to the receptacle 106. It will be noted that the $N_2$ gas flows from the port 114b in the block 114 to the port 112c in the block 112 through the groove 112g.

Figure 5C:
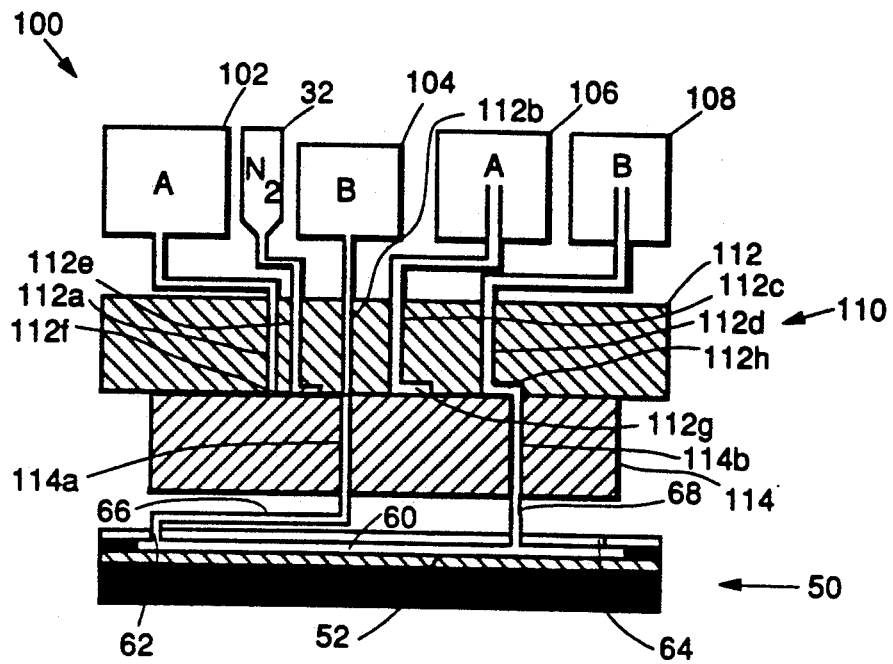

FIG. 5c illustrates the cell 50 as being filled with the chemical B. The block 114 is moved to a rightmost position in which the port 112b is aligned with the port 114a to connect the inlet conduit 66 to the container 104, and the groove 112h is aligned with the port 114b to connect the outlet conduit 68 to the receptacle 108 through the port 112d.

Figure 5D:
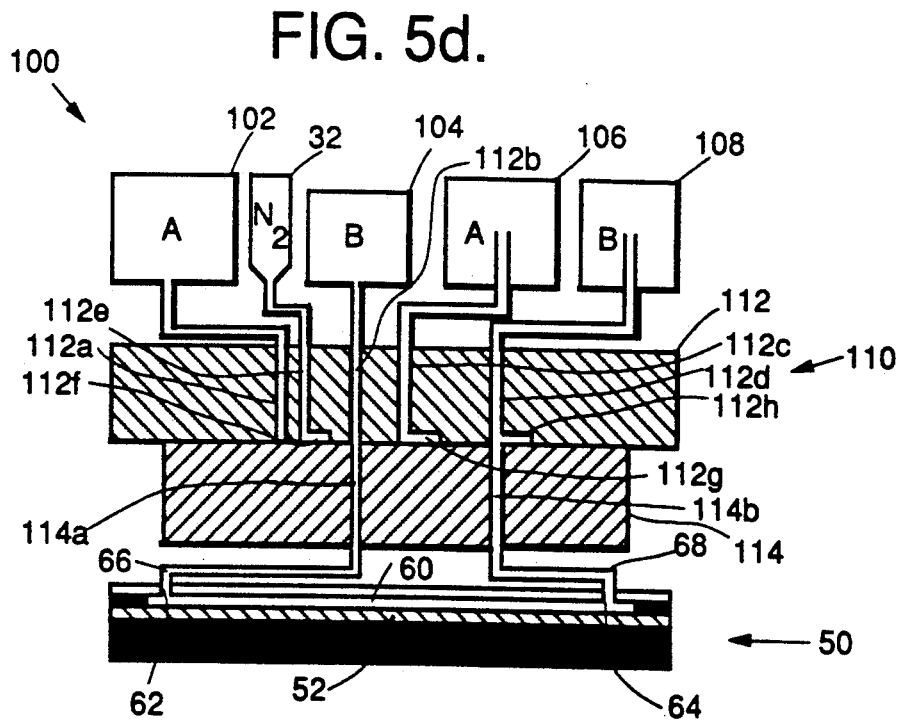

In FIG. 5d, the apparatus 100 is being purged of the chemical B. The block 114 is moved to an intermediate position in which the groove 112f is aligned with the port 114a to connect the inlet conduit 66 to the $N_2$ supply 32 through the port 112e, and the port 112d is aligned with the port 114b to connect the outlet conduit 68 to the receptacle 108.

The valve 110 can be further activated to stop all flow by simply moving the block 114 to any lateral position that totally misaligns either the port 114a, the port 114b or both of the ports 114a and 114b from any of the ports and grooves in the block 112. For example, flow of the chemical A can be stopped by moving the block 114 leftward from the position shown in FIG. 5a, until the port 114a is eclipsed by the bottom surface of the block 112 to the left of the port 112a, and the port 114b is midway between the ports 112b and 112c.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

I claim:

1. An apparatus for chemically processing a surface of an object, comprising:
    processing cell means for retaining the object such that said surface is exposed to a processing space, the cell means having an inlet and an outlet which open into said space;
    first container means for containing a first chemical;

second container means for containing a second chemical;

receptacle means; and valve means for selectably connecting the first container means to the inlet and the receptacle means to the outlet; or connecting the second container means to the inlet and the receptacle means to the outlet.

2. An apparatus as in claim 1, in which the valve means comprises means for periodically connecting the selected first or second container means to the inlet such that the first or second chemical respectively is supplied into said space in a pulsating manner.

3. An apparatus as in claim 2, in which the first and second container means comprise pressurizing means for urging the selected first or second chemical respectively to flow through the inlet into said space.

4. An apparatus as in claim 1, in which said space has a height above said surface of approximately 75-500 micrometers.

5. An apparatus as in claim 1, in which said space has a height above said surface of approximately 100 micrometers.

6. An apparatus as in claim 1, in which the outlet is laterally spaced from the inlet.

7. An apparatus as in claim 1, further comprising third container means for containing a gas which does not chemically react with said surface, the valve means being further constructed to selectably connect the third container means to the inlet and the receptacle means to the outlet.

8. An apparatus as in claim 1, in which the cell means comprises a wall through which the inlet and outlet open, and a gasket having a hole formed therethrough which is sealingly disposed between said wall and said surface to define said space therebetween.

9. An apparatus as in claim 1, in which the cell means includes an enclosure which defines said space and encloses the object therein.

10. An apparatus as in claim 9, in which:
the object is a wafer having a surface opposite to said surface and a peripheral edge; and
the cell means comprises means for retaining the object in the enclosure such that said surface, said opposite surface and said peripheral edge are exposed to said space.

11. An apparatus as in claim 1, in which:
the receptacle means comprises first receptacle means and second receptacle means; and
the valve means comprises means for connecting the first receptacle means to the outlet when the first container means is connected to the inlet; and connecting the second receptacle means to the outlet when the second container means is connected to the inlet.

12. An apparatus as in claim 1, further comprising timer means for selectably controlling the valve means to periodically connect the first container means to the inlet for a first predetermined length of time sufficient for the first chemical to fill said space, and disconnect the first container means from the inlet for a second predetermined length of time which is sufficient for a first predetermined chemical reaction between the first chemical in said space and said surface to occur; and controlling the valve means to periodically connect the second container means to the inlet for a third predetermined length of time sufficient for the second chemical to fill said space, and disconnect the second container from the inlet for a fourth predetermined length of time which is sufficient for a second predetermined chemical reaction between the second chemical in said space and said surface to occur.

13. A method of chemically processing a surface of an object, comprising the steps of:
(a) creating a processing space having a height above said surface of approximately 75-500 micrometers to which said surface is exposed; and
(b) causing a chemical to flow through said space in a pulsating manner.

14. A method as in claim 13, in which step (b) is performed periodically and comprises the substeps of:
(c) filling said space with a fresh volume of the chemical; and
d) allowing the chemical to remain in said space for a predetermined length of time which is sufficient for predetermined chemical reaction between the chemical in said space and said surface to occur.

* * * * *